United States Patent
Ryu et al.

(10) Patent No.: US 7,283,931 B2
(45) Date of Patent: *Oct. 16, 2007

(54) INSPECTING APPARATUS FOR SEMICONDUCTOR DEVICE

(75) Inventors: Je-hyoung Ryu, Suwon (KR); Sung-jin Lee, Suwon (KR); Jun-ho Lee, Yongin (KR); Tae-gyu Kim, Hwasung (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 162 days.

This patent is subject to a terminal disclaimer.

(21) Appl. No.: 10/820,747

(22) Filed: Apr. 9, 2004

(65) Prior Publication Data

US 2004/0260503 A1    Dec. 23, 2004

(30) Foreign Application Priority Data

Jun. 23, 2003    (KR) ...................... 10-2003-0040770

(51) Int. Cl.
- G06F 11/30    (2006.01)
- G21C 17/00    (2006.01)
- G01R 31/00    (2006.01)
- G01R 31/14    (2006.01)

(52) U.S. Cl. ...................................... 702/182; 702/118
(58) Field of Classification Search ............ 702/33–35, 702/108, 117, 118, 121, 130, 131, 132, 136, 702/182

See application file for complete search history.

(56) References Cited

U.S. PATENT DOCUMENTS

| | | | |
|---|---|---|---|
| 5,744,863 A | 4/1998 | Culnane et al. ............. | 257/712 |
| 5,929,651 A * | 7/1999 | Leas et al. .................. | 324/765 |
| 6,447,894 B1 * | 9/2002 | Hirotsuru et al. ........ | 428/307.7 |
| 6,720,784 B2 * | 4/2004 | Martter et al. .............. | 324/760 |
| 7,176,704 B2 * | 2/2007 | Ryu et al. .................... | 324/760 |
| 2004/0263193 A1 * | 12/2004 | Ryu et al. .................... | 324/765 |
| 2004/0263194 A1 * | 12/2004 | Ryu et al. .................... | 324/765 |
| 2005/0012498 A1 * | 1/2005 | Lee et al. ................ | 324/158.1 |

FOREIGN PATENT DOCUMENTS

| | | |
|---|---|---|
| JP | 63-283046 | 11/1988 |
| JP | 01-243561 | 9/1989 |
| JP | 4-120481 | 4/1992 |
| JP | 9-243704 | 9/1997 |

(Continued)

OTHER PUBLICATIONS

English Translation of KR 10-0312237, Dec. 2001.*

(Continued)

Primary Examiner—Michael P. Nghiem
(74) Attorney, Agent, or Firm—Staas & Halsey LLP

(57) ABSTRACT

An inspecting apparatus for a semiconductor device having a match plate; a contact module combined with the match plate, including a radiation unit contacting a semiconductor device, and a test unit pressing leads of the semiconductor device; and a thermally conductive pad installed on a contacting face of the radiation unit of the contact module, to transfer heat from the semiconductor device to the radiation unit of the contact module. The present invention provides an inspecting apparatus for semiconductor devices that improves reliability of testing for durability of semiconductor devices against heat, and minimizes damage to the semiconductor devices during testing.

13 Claims, 7 Drawing Sheets

FOREIGN PATENT DOCUMENTS

| | | | |
|---|---|---|---|
| JP | 2000-187060 | | 7/2000 |
| JP | 2002-286792 | | 10/2002 |
| JP | 2003-084030 | | 3/2003 |
| JP | 2003-3253224 | * | 9/2003 |
| KR | 96-705351 | | 10/1996 |
| KR | 1999-000619 | | 1/1999 |
| KR | 2000-0052405 | | 8/2000 |
| KR | 10-0312237 | | 10/2001 |

OTHER PUBLICATIONS

Korean Office Action issued on Jul. 12, 2005 (Partial English Translation).

Office Action issued by the Japanese Patent Office on Jun. 12, 2007 in the corresponding Japanese Application No. 2004-101340 (2 pages).

* cited by examiner

INSPECTING APPARATUS FOR SEMICONDUCTOR DEVICE

CROSS-REFERENCE TO RELATED APPLICATIONS

This application claims the benefit of Korean Patent Application No. 2003-40770, filed Jun. 23, 2003, in the Korean Intellectual Property Office, the disclosure of which is incorporated herein by reference.

BACKGROUND OF THE INVENTION

1. Field of the Invention

The present invention relates to an inspecting apparatus for a semiconductor device, and more specifically, to an inspecting apparatus that minimizes the number of semiconductor devices damaged due to faulty temperature measurements during heat durability testing.

2. Description of the Related Art

Generally, a handler device includes a handler to identify defective semiconductor devices, and a testing chamber to test the durability of semiconductor devices at elevated temperatures. The testing chamber plays an important role in improving the effectiveness of temperature testing of semiconductor devices.

A core technology of the testing chamber is a heating/cooling technology that maintains a constant temperature during testing, regardless of heat radiated from the semiconductor device. The heating/cooling technology is divided into two main methods, a direct cooling method that involves spraying air on the semiconductor device, and an indirect cooling method that involves installing a radiation fin on the semiconductor device and spraying the air on the radiation fin.

Most conventional inspecting apparatuses for semiconductor devices that use the indirect cooling method, are configured to place a heat sink directly on the semiconductor device to transfer the heat from the semiconductor device. Others use additional heat transfer means to transfer the heat from the semiconductor device to the heat sink during the heat durability testing.

When the heat sink is in direct contact with the semiconductor device, the contacting surfaces of the heat sink and the semiconductor device are difficult to align in parallel due to irregularities of the match plates and/or the roughness of the contacting surface of the semiconductor device. As a result, this structural problem prevents an efficient transfer of the heat from the semiconductor device to the heat sink.

Consequently, some of the heat is transferred to the air layer between the contacting surfaces of the heat sink and the semiconductor device, causing an increase in the temperature of the testing chamber. The increase in the temperature of the testing chamber causes the inspecting apparatus to misidentify a qualified semiconductor device as a defective semiconductor device. This misidentification occurs because the temperature of the semiconductor device is measured above the actual temperature of the semiconductor device due to the heat transfer. Therefore, the reliability of the durability testing is lowered. Additionally, physical contact between heat sinks and semiconductor devices frequently damage the semiconductor devices.

While inspecting apparatuses designed to transfer the heat from semiconductor devices to the heat sinks using additional heat transfer means exist, such devices not only require complex transfer structures, such as radiation members, but also are inefficient at transferring heat due to the minimal area of contact between the radiation members and the semiconductor devices.

The physical connections between the radiation members and the heat sinks have alignment problems similar to those described above. Also, the heat transferring efficiency and the misidentification rate of semiconductor devices remain at unacceptable levels.

SUMMARY OF THE INVENTION

Accordingly, it is an aspect of the present invention to provide an inspecting apparatus for semiconductor devices that improves the reliability of durability testing of semiconductor devices against heat, and minimizes the impact on the semiconductor devices during testing.

Additional aspects and advantages of the invention will be set forth in part in the description which follows and, in part, will be obvious from the description, or may be learned by practice of the invention.

The foregoing and/or other aspects of the present invention are achieved by providing an inspecting apparatus for a semiconductor device having a match plate; a contact module combined with the match plate including a radiation unit in contact with the semiconductor device and a test unit to contact the leads of the semiconductor device. A thermally conductive pad is installed on the contacting face of the radiation unit of the contact module to transfer heat from the semiconductor device to the radiation unit of the contact module.

According to an aspect of the invention, the thermally conductive pad includes a ceramic-silicon composite.

According to an aspect of the invention, the thermally conductive pad is installed on the radiation unit by a thermally conductive double-sided adhesive member.

According to an aspect of the invention, the thermal conductive double-sided adhesive member is made of acrylic polymer.

According to an aspect of the invention, the radiation unit of the contact module includes a heat sink; a contact pusher to contact the semiconductor device having the thermally conductive pad attached to the contacting face; and a heat flat pusher combined with the contact pusher and the heat sink to transfer the heat from the semiconductor device to the heat sink via the contact pusher.

According to an aspect of the invention, the heat sink is made of aluminum.

According to an aspect of the invention, the contact pusher and the heat flat pusher are made of aluminum.

According to an aspect of the invention, the test unit of the contact module includes a contact block combined with the match plate and formed with a heat sink seating part to accommodate the heat sink, the match plate having a through hole through which the heat flat pusher passes; and a lead pusher attached to the bottom of the contact block, and contacting the leads of the semiconductor device selectively according to the ascent and/or descent of the contact block by the match plate.

According to an aspect of the invention, the inspecting apparatus further comprises a first elastic member installed along the circumference of the heat flat pusher to lift the contact block and the lead pusher up and down elastically.

According to an aspect of the invention, the inspecting apparatus for semiconductor device further comprises a second elastic member that is installed between the match plate and the contact block to allow the contact block to move up and down elastically in accordance with the ascent and/or descent of the match plate, thereby contacting the lead pusher against the leads of the semiconductor device.

According to an aspect of the invention, the first elastic member and the second elastic member are springs.

BRIEF DESCRIPTION OF THE DRAWINGS

These and/or other aspects and advantages of the invention will become apparent and more readily appreciated from the following description of the embodiments, taken in conjunction with the accompany drawings of which.

DETAILED DESCRIPTION OF THE EMBODIMENTS

Figure 1:
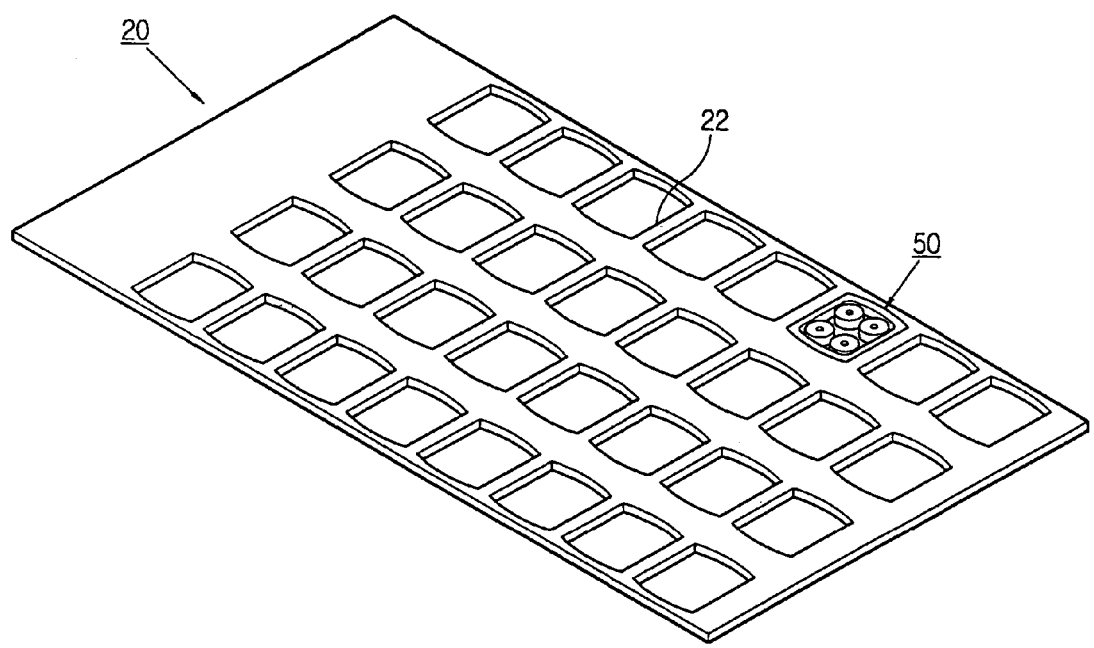
FIG. 1 is a perspective view of an inspecting apparatus for semiconductor devices according to the present invention.

Reference will now be made in detail to the embodiments of the present invention, examples of which are illustrated in the accompanying drawings, wherein like reference numerals refer to like elements throughout. The embodiments are described below in order to explain the present invention by referring to the figures.

Figure 2:
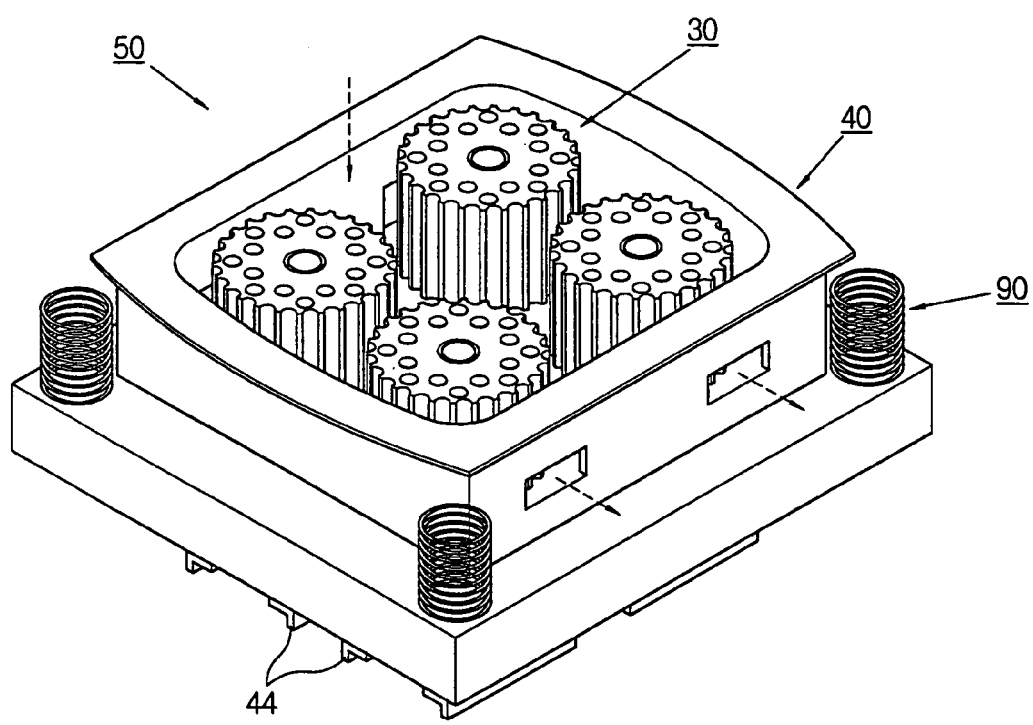
FIG. 2 is a perspective view of a contact module of the inspecting apparatus for semiconductor devices according to the present invention.
Figure 3:
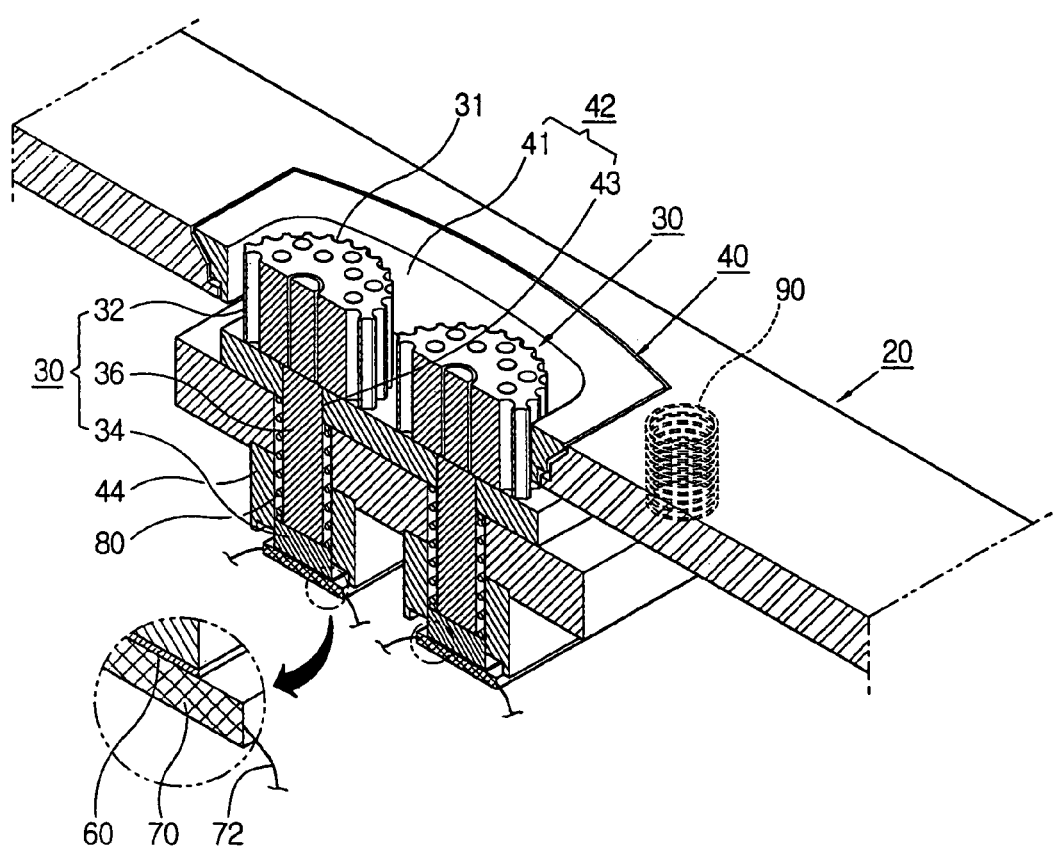
FIG. 3 is a cross-sectional view of a combining structure of a match plate and the contact module of the inspecting apparatus for semiconductor devices according to the present invention.

FIG. 1 is a perspective view of an inspecting apparatus for semiconductor devices according to the present invention. FIG. 2 is a perspective view of a contact module of the inspecting apparatus. FIG. 3 is a cross-sectional view of the combining structure of a match plate and a contact module of the inspecting apparatus according to the present invention.

As illustrated in FIGS. 1-3, the inspecting apparatus for semiconductor devices according to the present invention includes a match plate 20, a contact module 50 combined with the match plate 20 and having a radiation unit 30 that contacts a semiconductor device 70, a test unit 40 to contact the leads 72 of the semiconductor device 70, and a thermally conductive pad 60 installed on a contacting face of the radiation unit 30 to transfer heat from the semiconductor device 70 to the radiation unit 30.

The match plate 20 is formed with combining holes 22 capable of combining with a plurality of contact modules 50. The match plate 20 allows the test unit 40 to be selectively raised or lowered to test the operability of semiconductor devices 70 when exposed to temperature changes. The structure of the match plate 20 may vary according to necessity.

The radiation unit 30 of the contact module 50 comprises a heat sink 32, a contact pusher 34 contacting the semiconductor device 70 and having the thermal conductive pad 60 installed on the contacting face of the contact pusher 34, and a heat flat pusher 36 combining with the contact pusher 34 and the heat sink 32 to transfer the heat from the semiconductor device 70 to the heat sink 32 via the contact pusher 34.

The heat sink 32 radiates heat transferred from the semiconductor device 70 via the contact pusher 34 and the heat flat pusher 36 away from the semiconductor device 70. The heat sink 32 is formed with a plurality of groove strips 31 on the external surface of a cylindrical protrusion to increase the surface area in contact with the air. Also, the heat sink 32 may be made of various types of materials. Aluminum and aluminum alloy are good examples because they have excellent thermal conductivity and are available at competitive prices.

The contact pusher 34, which contacts the semiconductor device 70, has a thermally conductive pad 60 to efficiently transfer the heat from the semiconductor device 70 to the heat sink 32 with only minimal leakage of the heat during performance testing by maximizing the contacting area. The thermally conductive pad 60 also minimizes any impact resulting from physical contact with the semiconductor device 70. The configuration and a function of the thermally conductive pad 60 will be described later in reference to FIG. 4.

The heat flat pusher 36 is formed with male screw taps on opposite ends. Also, the heat sink 32 and the contact pusher 34 are formed with female taps corresponding to the male screw taps of the heat flat pusher 36. The heat flat pusher 36 and its combining structure may vary according to necessity.

Similar to the heat sink 32, the contact pusher 34 and the heat flat pusher 36 can be made of various materials, examples of which include aluminum and aluminum alloy, which have superior thermal conductivity and are available at competitive prices.

The test unit 40 of the contact module 50 is combined with the match plate 20 and includes a contact block 42 formed with a heat sink seat 41 where the heat sink 32 is seated and with a through hole 43 through which the heat flat pusher 36 passes. The test unit 40 also has a lead pusher 44 that is installed on the bottom of the contact block 42 and selectively contacts the leads 72 of the semiconductor device 70 according to the vertical positioning of the contact block 42 as adjusted by the match plate 20.

The contact block 42 is formed with an air inflow hole and an air outflow hole, through which the air flows in and out, respectively. The contact block 42 can also be formed with a plurality of air inflow holes and air outflow holes.

The lead pusher 44 contacts the leads 72 of the semiconductor device 70 to electrically connect the semiconductor device 70 to a test circuit (not shown) to test the operation of the semiconductor device when exposed to elevated temperatures.

A first elastic member 80 is installed on the circumference of the heat flat pusher 36 of the radiation unit 30, and a second elastic member 90 is installed between the match plate 20 and the contact block 42. As the match plate 20 lifts up and down, the contact block 42, which is elastically combined with the match plate 20, presses the contact pusher 34 against the semiconductor device 70 and the lead pusher 44 against the leads 72 of the semiconductor device 70.

The first elastic member 80 moves according to the vertical positioning of the contact block 42 to press the contact pusher 34 against the semiconductor device 70.

The match plate 20 and the contact block 42 are elastically attached by the second elastic member 90.

The first elastic member 80 and the second elastic member 90 may be made of various elastic materials. A spring may be used as the elastic member because of its simple structure and elastic properties.

The heat from the semiconductor device 70 is transferred to the heat sink 32 via the thermally conductive pad 60, the contact pusher 34, and the heat flat pusher 36.

Figure 4:
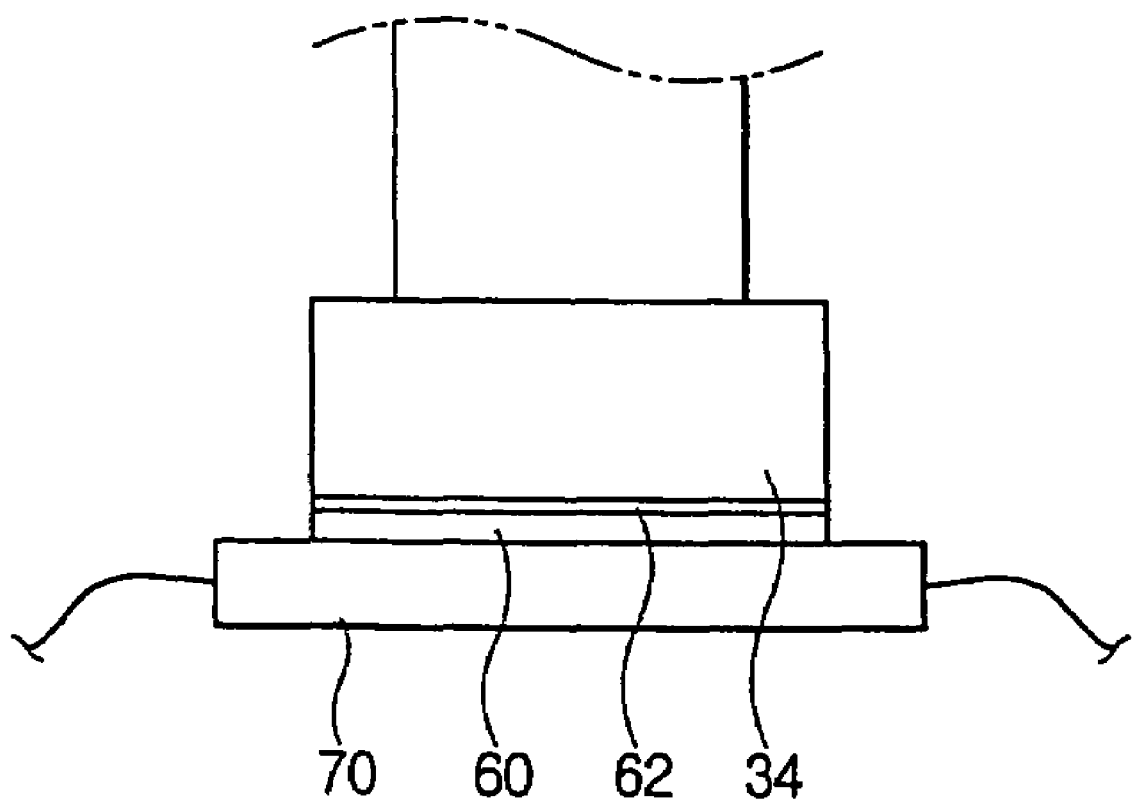
FIG. 4 is a cross-sectional view of a combining structure of a thermal conductive pad of the inspecting apparatus for semiconductor devices according to the present invention.

FIG. 4 is a cross-sectional view of the combining structure of the thermally conductive pad 60 installed on the radiation unit 30 of the contact module 50 of the inspecting apparatus for semiconductor devices according to the present invention.

Here, the thermally conductive pad 60 is made of a ceramic-silicon composite or material including a ceramic-silicon composite with relatively high thermal conductivity, flexibility, compressibility, thermal resistance, and electric resistance. The thermally conductive pad 60 may also be made of various other materials according to necessity. Also, the thermally conductive pad 60 should be thick enough to allow compression of 1~2 mm.

The thermally conductive pad 60 is installed on the contact pusher 34 by a thermally conductive double-sided adhesive tape 62, wherein the thermally conductive double-sided adhesive tape 62 is made of an acrylic polymer, or a material including an acrylic polymer, with a high thermal resistance allowing for a firm bonding force and good thermal conductivity. The thickness of the thermally conductive double-sided adhesive tape 62 is less than 0.2 mm to minimize the thermal resistance. The thickness of the adhesive can vary according to the thermal resistance properties of the adhesive material being used. As the resistance of the material decreases, the thickness may be increased.

While the temperature in the testing chamber of the inspecting apparatus for semiconductor devices installed with a thermally conductive pad 60 may increase, the amount of the increase is insignificant. Therefore the inspecting apparatus for semiconductor devices radically reduces the increase in the temperature of the testing chamber caused by the heat from the semiconductor device 70.

Figure 5A:
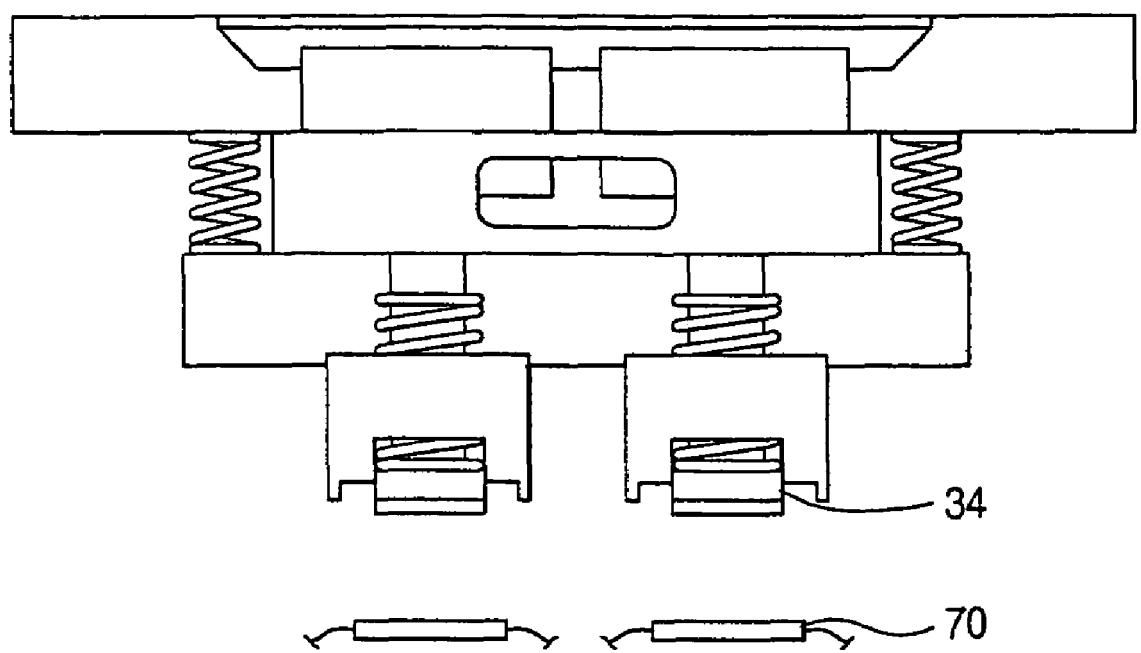
FIGS. 5A, 5B, and 5C are operation views of the inspecting apparatus for semiconductor devices according to the present invention.
Figure 5B:
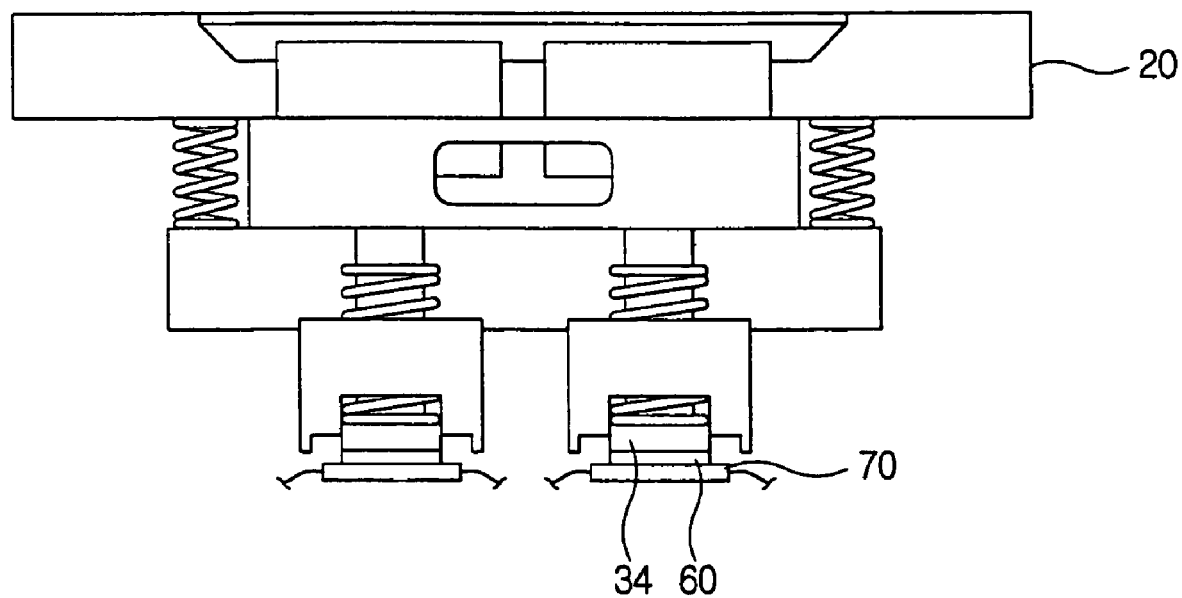
Figure 5C:
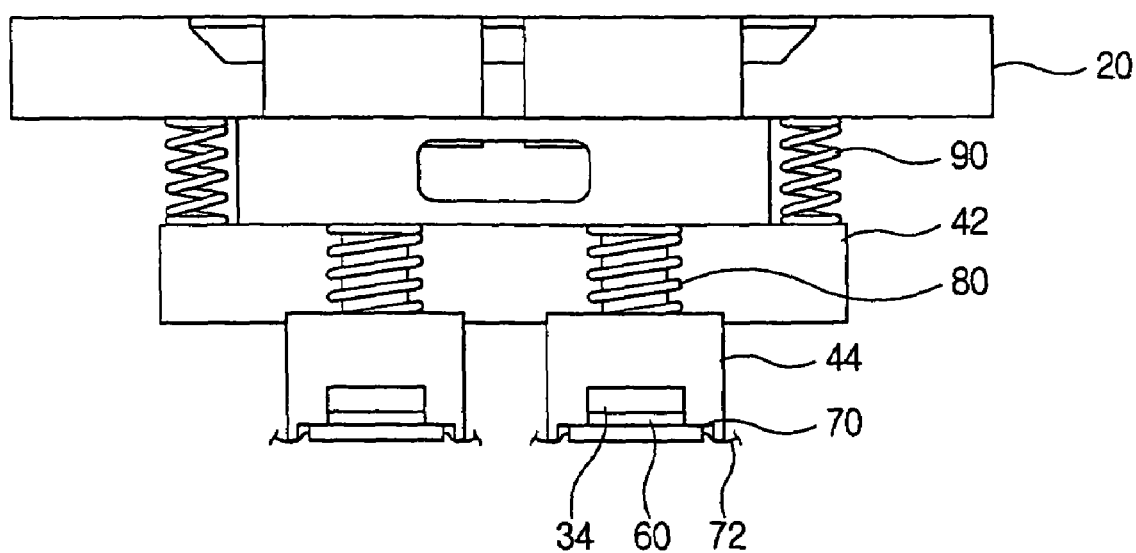

FIGS. 5A, 5B, and 5C are operational views of the inspecting apparatus for the semiconductor devices according to the present invention.

First, the semiconductor device 70 is inserted into the testing chamber and is positioned corresponding to the bottom of the contact pusher 34.

Next, the contact pusher 34 contacts the semiconductor device 70 when the match plate 20 is positioned. Herein, any excessive force from the contact pusher 34, at the moment the contact pusher 34 contacts the semiconductor device 70, is absorbed by the thermally conductive pad 60 installed on the contact pusher 34 (refer to FIG. 5B), the first elastic member 80, and the second elastic member 90.

Lastly, after the thermally conductive pad 60 of the contact pusher 34 contacts the semiconductor device 70, the match plate 20 descends enough to press the lead pusher 44 against the leads 72 of the semiconductor device 70. The contact block 42 moves according to the operation of the match plate so that the lead pusher 44 electrically contacts the test circuit (not shown) and allows testing to commence. After the testing, the operation process described above is executed in reverse order. Additionally, as the match plate 20 descends to press the leads 72 of the semiconductor device 70 compressing the second elastic member 90, the first elastic member 80 is also compressed to press the contact pusher 34 and the thermally conductive pad 60 against the semiconductor device 70 (refer to FIG. 5C).

Consequently, the air layer between the contacting faces of the contact pusher 34 and the semiconductor device 70 can be eliminated, minimizing the temperature variation of the chamber unit due to leakage of heat radiated from the semiconductor device 70 during testing.

As described above, the inspecting apparatus for semiconductor devices according to the present invention not only minimizes the rejection rate of semiconductor devices by improving the reliability of testing by using a thermally conductive pad, but also efficiently prevents damage to the semiconductor devices during the test.

Hence, the inspecting apparatus for semiconductor devices can lower expenses due to faulty test results and damage caused during testing.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An inspecting apparatus for a semiconductor device comprising:
   a match plate;
   a contact module combined with the match plate, the contact module comprising:
      a radiator to contact the semiconductor device, and
      a tester to contact leads of the semiconductor device, and
   a thermally conductive pad installed on a contacting face of the radiator, to transfer heat from the semiconductor device to the radiator,
   wherein the thermally conductive pad is installed on the radiator using a thermally conductive double-sided adhesive member, and
   the radiator comprises:
      a heat sink,
      a contact pusher to contact the semiconductor device having the thermally conductive pad attached to the contacting face, and
      a heat flat pusher combined with the contact pusher and the heat sink to transfer heat from the semiconductor device to the heat sink via the contact pusher.

2. The inspecting apparatus for the semiconductor device according to claim 1, wherein the thermally conductive pad is compressible.

3. The inspecting apparatus for the semiconductor device according to claim 1, wherein the thermally conductive pad is compressible from 1-2 mm.

4. The inspecting apparatus for the semiconductor device according to claim 1, wherein the thermally conductive pad comprises a ceramic-silicon composite.

5. The inspecting apparatus for the semiconductor device according to claim 4, wherein the thermally conductive double-sided adhesive member comprises an acrylic polymer.

6. The inspecting apparatus for the semiconductor device according to claim 1, wherein the thermally conductive double-sided adhesive member comprises an acrylic polymer.

7. An inspecting apparatus for a semiconductor device comprising:
   a match plate;
   a contact module combined with the match plate, the contact module comprising:
      a radiator to contact the semiconductor device, and
      a tester to contact leads of the semiconductor device, and
   a thermally conductive pad installed on a contacting face of the radiator, to transfer heat from the semiconductor device to the radiator;
   a plurality of contact modules;

a contact block having a bottom;

a lead pusher attached to the bottom of the contact block; and an elastic member installed between the match plate and the contact block, to allow the contact block to elastically move up and down corresponding to ascent and descent of the match plate, thereby pressing the lead pusher against the leads of the semiconductor device, wherein the match plate is formed with a plurality of combining holes combinable with the plurality of contact modules.

8. An inspecting apparatus for a semiconductor device comprising:

a match plate;

a contact module combined with the match plate, the contact module comprising:

a radiator to contact the semiconductor device, and a tester to contact leads of the semiconductor device, and a thermally conductive pad installed on a contacting face of the radiator, to transfer heat from the semiconductor device to the radiator;

a heat sink;

a contact pusher to contact the semiconductor device having the thermally conductive pad attached to the contacting face;

a heat flat pusher having a circumference combined with the contact pusher and the heat sink to transfer heat from the semiconductor device to the heat sink via the contact pusher;

a contact block having a bottom;

a lead pusher attached to the bottom of the contact block; and a first elastic member installed on the circumference of the heat flat pusher to elastically connect the contact block and the lead pusher.

9. The inspecting apparatus for the semiconductor device according to claim 8, further comprising a second elastic member installed between the match plate and the contact block, to allow the contact block to elastically move up and down corresponding to ascent and descent of the match plate, thereby pressing the lead pusher against the leads of the semiconductor device.

10. The inspecting apparatus for the semiconductor device according to claim 9, wherein the second elastic member is a spring.

11. The inspecting apparatus for the semiconductor device according to claim 9, wherein the first elastic member and the second elastic member are springs.

12. The inspecting apparatus for the semiconductor device according to claim 8, wherein the first elastic member is a spring.

13. An apparatus for testing semiconductor devices comprising:

a match plate having a plurality of combining holes; and a plurality of contact modules combined with the plurality of combining holes respectively, the contact modules comprising:

a plurality of thermally conductive pads to contact the semiconductor devices and transfer heat away from the semiconductor devices, a plurality of contact pushers to transfer heat from the thermally conductive pads, the contact pushers having the thermally conductive pads respectively attached to contacting faces by thermally conductive adhesives, a plurality of heat flat pushers, combined with the contact pushers respectively, to transfer heat from the contact pushers, a plurality of heat sinks to transfer heat from the heat flat pushers and to radiate the heat away from the semiconductor devices, the heat sinks being combined with the heat flat pushers respectively, and formed with a plurality of grooves to increase a surface area of the heat sinks, a plurality of lead pushers to selectively contact leads of the semiconductor devices, and a contact block combined with the lead pushers, the contact block being elastically combined with the contact pushers by a plurality of first elastic devices and elastically combined with the match plate by a plurality of second elastic devices, the contact block being formed with a plurality of through holes in which the heat flat pushers are located.

* * * * *